United States Patent [19]
Firl et al.

[11] Patent Number: 4,989,317
[45] Date of Patent: Feb. 5, 1991

[54] METHOD FOR MAKING TAB CIRCUIT ELECTRICAL CONNECTOR SUPPORTING MULTIPLE COMPONENTS THEREON

[75] Inventors: Gerold Firl, Poway; Stuart D. Asakawa, San Diego, both of Calif.

[73] Assignee: Hewlett-Packard Company, Palo Alto, Calif.

[21] Appl. No.: 274,534

[22] Filed: Nov. 21, 1988

[51] Int. Cl.[5] .............................................. H05K 3/02
[52] U.S. Cl. ........................................ 29/840; 29/827; 29/847; 174/52.4; 228/180.2; 346/75; 357/74; 437/207
[58] Field of Search .................. 29/611, 827, 847, 840; 174/68.5, 52.4; 228/180.2; 439/206, 207; 357/70; 346/75, 140 R

[56] References Cited

U.S. PATENT DOCUMENTS

| | | | |
|---|---|---|---|
| 3,689,991 | 9/1972 | Aird | 437/207 |
| 4,316,320 | 2/1982 | Nogawa et al. | 174/52.4 X |
| 4,631,553 | 12/1986 | Sekiya | 346/75 X |
| 4,635,073 | 1/1987 | Hanson . | |
| 4,680,859 | 7/1987 | Johnson | 29/611 |
| 4,683,481 | 7/1987 | Johnson | 346/75 X |
| 4,701,781 | 10/1987 | Sankhagowit | 357/74 X |

FOREIGN PATENT DOCUMENTS 2498873  7/1982  France .
2017416  of 1979  United Kingdom .
2004127  3/1979  United Kingdom .

OTHER PUBLICATIONS

IBM Technical Disclosure Bulletin, vol. 30, No. 9, Feb. 1988, pp. 116–117.

Primary Examiner—Carl E. Hall
Assistant Examiner—Carl J. Arbes

[57] ABSTRACT

A flexible interconnect circuit having at least two connected components within its periphery is formed with electrically conductive traces on a nonconductive plastic support. The components are interconnected to each other, and to external locations, with the interconnect circuit. As part of the manufacturing process, the conductive traces are typically electroplated with gold. The traces must be contacted as electrodes during electrodeposition, and the contacting is done using bus connectors along the periphery of the support. Isolated traces, not contacting the periphery and typically extending only between the components within the periphery, are contacted by providing removable bus connectors on the nonconductive support. When plating is complete, the removable bus connectors are removed, preferably by die cutting away those portions of the support having the unneeded bus connectors.

12 Claims, 2 Drawing Sheets

METHOD FOR MAKING TAB CIRCUIT ELECTRICAL CONNECTOR SUPPORTING MULTIPLE COMPONENTS THEREON

BACKGROUND OF THE INVENTION

This invention relates to connectors for making electrical connections to electrical components, and, more particular, to a flexible interconnect circuit having electrical traces supported on an electrically insulating substrate.

One of the continuing trends in the electronics and electromechanical apparatus industries has been reducing the size of many components and types of apparatus. There are many reasons to strive for reduced size, but generally miniaturization increases the speed of operation of electronic devices, reduces the cost of components and apparatus, and increases the numbers of functions that they can perform.

As the size of the components is reduced, the difficulty in providing electrical interconnections between components and to components becomes greater. Assuming that the number of required external connections for any particular component remains approximately constant even as the size is reduced, the space around the periphery of the device that is available to make the connections becomes smaller. Thus, for example, a 10 fold reduction in component size also reduces the available length of periphery by 10 fold.

Since the linear length and space required to make external connections typically does not scale downwardly, the reductions in component size have prompted many approaches to improved connectability. In one, a flexible connector material called a TAB (for Tape Automated Bonding) flexible interconnect circuit material has been introduced. A TAB circuit electrical connector material includes a flexible insulating support layer, typically made of a plastic material, and particularly a polyimide such as Kapton. Traces of electrically conducting material are formed on the surface of the support layer. The traces are normally made of copper which is electroplated with gold to reduce oxidation.

The TAB circuit bonding approach is widely used to make various types of devices. For example, U.S. Pat. Nos. 3,689,991 and 4,649,415, which are incorporated by reference, describe the use of flexible circuit bonding to semiconductor components. U.S. Pat. No. 4,635,073, which is incorporated by reference, describes the use of flexible circuit bonding for thermal ink jet printer print heads. This approach of flexible TAB circuit bonding is particularly suited for manufacturing large numbers of identically configured circuits because the bonding material is manufactured in long strips or rolls and the bonding operation is automated.

In use, the custom flexible interconnect circuit is fabricated, and then it is attached to the component for which it is designed. The component typically is placed within the periphery of the interconnect circuit, either within an aperture cut through the interconnect circuit or mounted directly upon the plastic support of the interconnect circuit. One end of each trace of the interconnect circuit is bonded to the appropriate bonding point of the leads of the component, and the other end provides external access.

Although its use has greatly increased the efficiency of many manufacturing operations, the flexible circuit bonding approach has drawbacks in practice. It is difficult to place more than one component within the periphery of a flexible circuit, due to manufacturing problems that are encountered in forming the traces that run between the components on the flexible circuit. Accordingly, there is a need for an improved manufacturing approach to producing flexible interconnect circuit material, which permits the placing of more than one component on the circuit. The present invention fulfills this need, and further provides related advantages.

SUMMARY OF THE INVENTION

The present invention provides a method for manufacturing a flexible interconnect circuit, wherein the traces are plated with a protective layer, for use in devices having more than one component to be connected within the periphery of the circuit. Such an approach greatly increases the versatility of the circuits and devices made therewith, by permitting processing on the circuit itself using multiple components. In a typical use, a primary component is supported by secondary components that perform some or all of the processing functions, with both the primary and secondary components mounted on a single flexible interconnect circuit.

In accordance with the invention, a method for forming an electrical device having at least two components interconnected by a flexible electrical connector material having conductive traces supported on a nonconductive support, the components being disposed within the periphery of the nonconductive support comprises the steps of providing a composite of an electrical conductor material on a nonconductive support; removing a portion of the electrical conductor material to form a pattern of traces and plating bus connections, the bus connections providing an electrically continuous path from each trace to the periphery of the support; electrodepositing a metallic coating over the electrical conductor material, utilizing as one electrodeposition contact the plating bus at the periphery of the support; removing the plating bus connections at the periphery of the support; removing those plating internal bus connections extending from the periphery of the support to those traces that interconnect the components without otherwise extending to the periphery of the electrically insulating support; and connecting the electrical connector locations on the electrical components to the appropriate traces of the flexible electrical connector.

Where two or more components of the device are to be interconnected by the same flexible interconnect circuit, or TABcircuit, there will be some traces that run to the periphery of the circuit for external connection, and other traces that run from one component to another component. Those traces that run to the periphery of the circuit are readily electrodeposited with gold or other oxidation and corrosion resistant metal using bus bar connection points that run along the periphery of the circuit.

Those traces that run between components have no continuous electrical connection with the periphery of the circuit, and therefore cannot be electroplated readily. Such isolated traces are sometimes called "orphan traces". In the present approach, additional internal bus bar electrical connections are etched into the metallic layer at the same time the traces are etched. The internal bus bar connections extend from the orphan traces to the periphery of the circuit, to connect with the bus at the periphery. Plating is conducted, and then the periphery bus connections and the internal bus connections are removed. The internal bus connections made to the orphan traces are within the interior of the flexible circuit, and are preferably removed by die cutting or punching, leaving a cleanly defined aperture through the flexible circuit.

The present invention is preferably used in conjection with the flexible interconnect circuits of thermal ink jet printer print heads. In such application, there is a primary component served by the flexible interconnect circuit, the ink ejector. The flexible interconnect circuit is mounted on the ink ejector support, and the necessary electrical connections made. Additionally, it may be desirable to provide other active components, such as a multiplexer, mounted on the circuit support within the periphery of the interconnect circuit. Some traces run from the periphery of the circuit to the ejector, some traces run from the periphery to the multiplexer, and some from the multiplexer to the ejector. The traces from the multiplexer to the ejector are the isolated or orphan traces, and can profitably utilize the internal bus connectors of the present invention.

In accordance with this more specific aspect of the invention, a method for forming an electrical device having at least two components interconnected by a flexible electrical connector material having conductive traces supported on a nonconductive support, the components being disposed within the periphery of the nonconductive support with at least one of the components being mounted on the nonconductive support and at least one of the components being within an aperture through the support comprises the steps of providing a composite of an electrical conductor material on a nonconductive support; removing a portion of the electrical conductor material to form a pattern of traces and plating bus connections, the bus connections providing an electrically continuous path from those traces that interconnect between the two components within the periphery of the support, to the periphery of the support; electrodepositing a metallic coating over the electrical conductor material, utilizing as one electrodeposition contact the plating bus at the periphery of the support; removing the plating bus connections at the periphery of the support; removing those plating internal bus connections extending from the periphery of the support to those traces that interconnect the components without otherwise extending to the periphery of the electrically insulating support; and connecting the electrical connector locations on the electrical components to the appropriate traces of the flexible electrical connector.

The invention also extends to the method of making the flexible interconnect circuit itself. In accordance with this aspect of the invention, a method for preparing a flexible electrical connector material having conductive traces supported on a nonconductive support, at least some of the traces having no continuous connection to the periphery of the support, comprises the steps of providing a composite of an electrical conductor material on a nonconductive support; removing a portion of the electrical conductor material to form a pattern of traces and plating bus connections, the bus connections providing as electrically continuous path from each trace to the periphery of the support; electrodepositing a metallic coating over the electrical conductor material, utilizing as one electrodeposition contact the plating bus at the periphery of the support; removing the plating bus connections at the periphery of the support; and removing those portions of the electrical bus connections extending from the periphery of the support to those traces having no continuous connection to the periphery.

The present invention therefore provides a manufacturing process that is readily introduced into large scale fabrication of devices. The cost of the device is increased only marginally, if at all. The versatility afforded device designers is significantly increased by permitting them to incorporate two or more components onto a single flexible interconnect circuit. Other features and advantages of the invention will be apparent from the following more detailed description of the preferred embodiment, taken in conjunction with the accompanying drawings, which illustrate, by way of example, the principles of the invention.

DETAILED DESCRIPTION OF THE INVENTION AND THE PREFERRED EMBODIMENTS

The presently preferred application of the present invention is in conjunction with a thermal ink jet printhead assembly 10, used to eject microdroplets of ink toward a print medium in a precisely controlled array. Such a printhead assembly is disclosed in U.S. Pat. No. 4,635,073.

Figure 1:
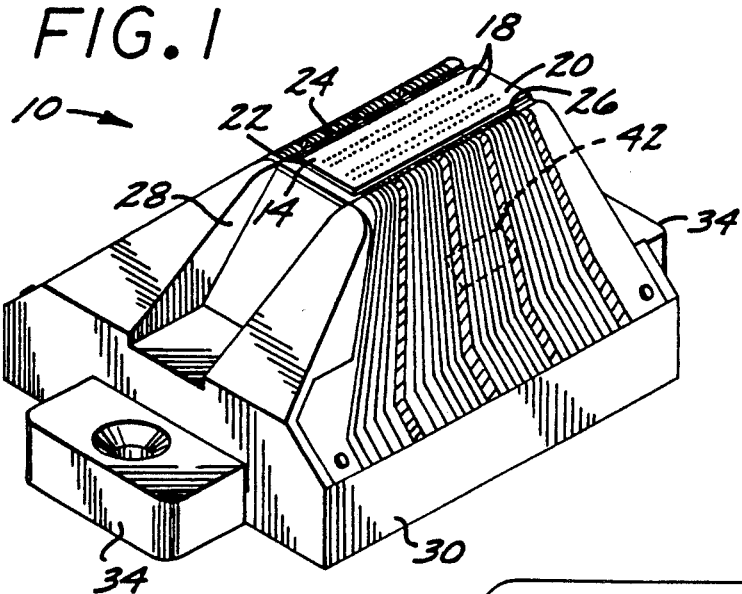
FIG. 1 is a perspective view of a thermal ink jet print head assembly.

Briefly, and referring to FIG. 1, the printhead assembly 10 includes an ejector 12 having a silicon substrate 14 with an elongated slot 16 therein which serves as an ink intake port for providing ink to a plurality of ink reservoirs (not shown) and to corresponding ink ejection orifices 18 in an orifice plate 20 overlying the substrate 14. Ink is ejected through the orifices 18 by localized heating of the silicon substrate 14. To effect such heating, the silicon substrate 14 has a plurality of tantalum-aluminum alloy resistors (not shown), one located adjacent each orifice 18. Electrical current is provided to each resistor through a lead 22 deposited upon the silicon substrate 14, each lead 22 terminating near the edge of the substrate 14 in a bonding location 24. A current delivered to a particular resistor causes the ink adjacent the resistor to be heated and vaporized, ejecting a microdroplet of ink through the orifice 18 adjacent the resistor. The present invention deals with the approach for providing electrical interconnections, not directly with the ejector 12 or its mode of operation. The structure and operation of ink ejectors is described more completely in the Hewlett Packard Journal, Volume 36, Number 5, May 1985, which disclosure is herein incorporated by reference.

Figure 2:
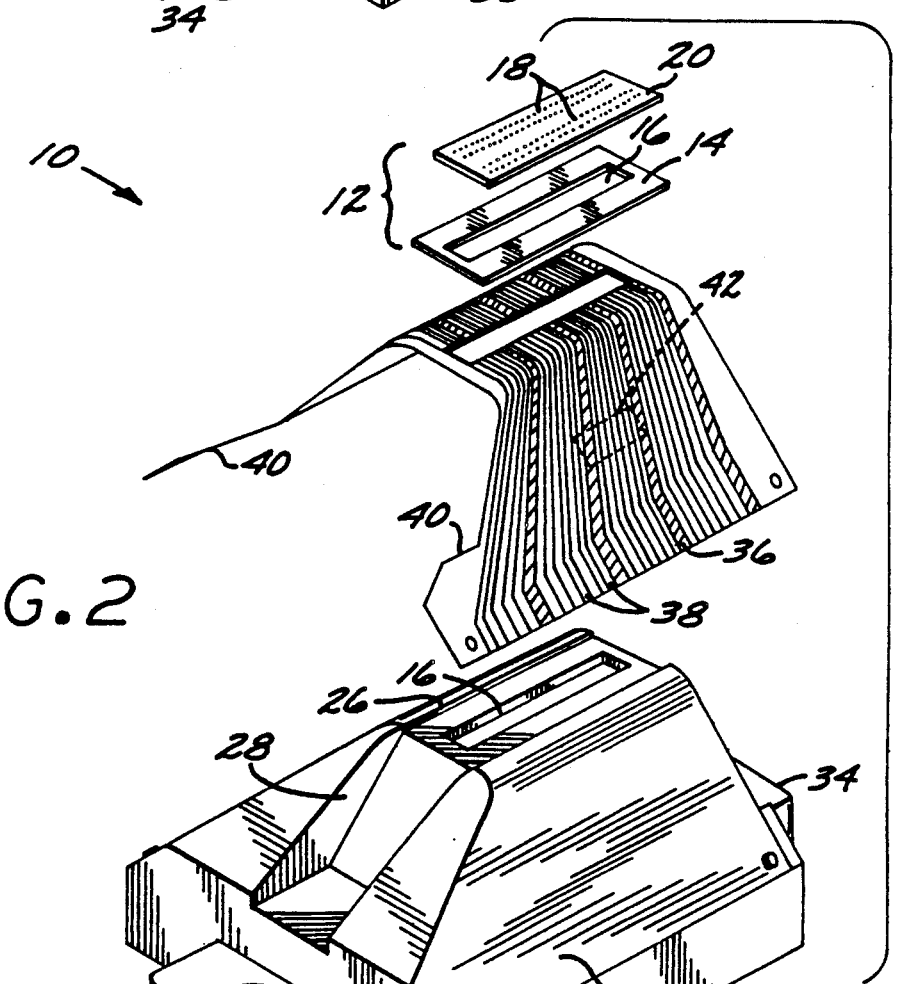
FIG. 2 is an exploded perspective view of the thermal ink jet print head assembly of FIG. 1'

The ejector 12 is mounted in a recess 26 in the top of a central raised portion 28 of a plastic or metal manifold 30 to place it close to the print medium, as may best be seen in the exploded view of FIG. 2. The raised portion 28 has slanted side walls 32. The raised portion also has end tabs 34, which facilitate its handling and attachment to a carriage mechanism (not shown) in the printer.

Figure 3:
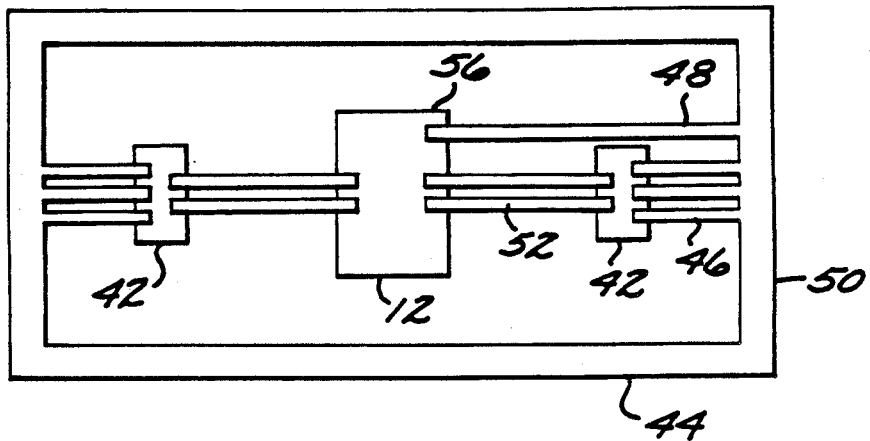
FIG. 3 is a plan view of a portion of the flexible interconnect circuit shown in FIG. 2 during fabrication, with some traces and bus connections not shown for clarity.
Figure 4:
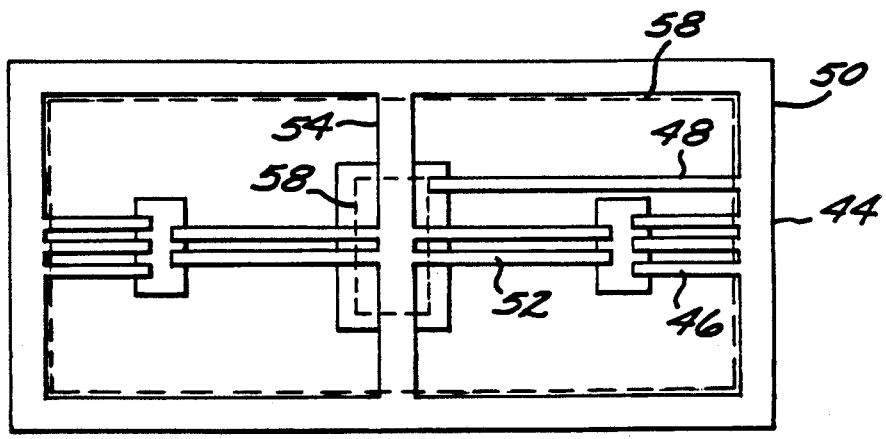
FIG. 4 is a plan view similar to FIG. 3, except at an earlier stage of fabrication, with the additional bus connections to the orphan traces shown.

Electrical current is supplied to the bonding locations 24 on the silicon substrate 14 through a flexible interconnect circuit 36, also sometimes known as a TABcircuit, illustrated in schematic plan view in FIGS. 3 and 4. The general features and structure of such flexible interconnect circuits 36, and the method of their fabrication, are described in U.S. Pat. No. 3,689,991. The present invention deals with a modified form of construction of the flexible interconnect circuit 36.

Generally, the flexible interconnect circuit 36 is manufactured as a flat piece and then molded to fit over the raised portion 28 and down the side walls 32 of the manifold 30. Electrical traces on the flexible interconnect circuit 36 are bonded at the end adjacent the substrate 14 to the bonding locations 24, and at the other end to external current leads (not shown). Electrical current is introduced into the respective resistors of the ejector 12 through the individual traces of the flexible interconnect circuit 36.

In manufacturing the interconnect circuit 36, a thin layer of electrically conductive metal, preferably copper, is deposited upon a continuous layer support 40 of flexible polyimide plastic such as Kapton, forming a composite of metal on a nonmetallic support. The electrically conductive metal may be deposited in any of several ways, the two most common being electrolytic deposition from solution and adhesive bonding of a thin sheet of metal to the substrate. The layer of conductive metal is patterned by standard photoresist techniques to produce individual conductive traces 38 in the proper pattern to deliver current to the intended locations. The electrical connection to the bonding locations on the substrate is provided by extending the traces in a cantilevered fashion from the edge of the plastic support in a pattern that places them over the respective bonding locations 24 when the flexible interconnect circuit 36 is assembled to the manifold 30. (See FIG. 6 of U.S. Pat. No. 3,689,991 and the text at col. 3, line 53-col. 4, line 4.) The cantilevered traces are soldered to the bonding locations using a combination of heat and pressure, which bends the cantilevered traces downwardly to contact the bonding locations.

In a more advanced form of the printhead assembly 10, a multiplexer 42 is supported on the flexible interconnect circuit 36. Like the ejector 12, the multiplexer 42 is within the periphery 44 of the circuit 36. The multiplexer 42 is required because of an increased number of orifices 18, which require an equal number of resistors to heat the ink and eject droplets.

FIG. 3 illustrates the relationship between the ejector 12, the multiplexer 42, and the traces. Some traces 46 run from the periphery 44 to the multiplexer 42, and some traces 48 run from the periphery 44 to the ejector 12. (In FIGS. 3 and 4, only a few illustrative traces are shown for clarity. In an actual circuit, there may be several hundred individual traces.) All of these traces 46 and 48 extend to the periphery, and during the manufacturing step illustrated in FIG. 3 connect directly with a periphery bus connector 50 that runs along the edge of the circuit 36. The traces 46 and 48 are readily electroplated during manufacturing, as with gold, by applying the proper voltage and current to the bus connector 50.

However, some traces 52 ("orphan traces") run from the multiplexer 42 to the ejector 12. During manufacturing, no plating voltage and current can be applied directly to the traces 52 from a connection at the periphery 44 of the circuit 36, because there is no continuous current path to the traces 52. The multiplexer 42 and ejector 12 are not present during the early stages of the manufacturing operation, when plating is performed, and their structure cannot aid in the plating. Thus, at the plating stage, the traces 52 are otherwise isolated from the periphery 44 and the periphery bus connector 50, and could not be plated but for the approach of the invention.

To accomplish electrodeposition of gold on the orphan traces 52 by electroplating, internal bus connectors 54 are provided, as illustrated in FIG. 4. The internal bus connectors 54 extend from the periphery bus connector 50 to the orphan traces 52, so that an electrical voltage and current may be applied to the traces 52 from the periphery 44 of the circuit 36.

The internal bus connectors 54 are formed during the same etching step that forms the traces 38 (more specifically, the traces 46, 48, and 52) and the periphery bus connector 50. A sheet of conductive material is deposited upon the support 40, and patterned by a photolithography technique. In this technique, a mask material is applied to the conductive sheet and the appropriate portions of the photoresistive mask removed to expose the portions of the conductive sheet that are to be removed. The patterning is accomplished by photolithographic procedures well established in the art. The portions to be removed are etched away to leave a pattern of traces and bus connectors, as illustrated in FIG. 4.

Electroplating of the traces 38 (including traces 46, 48, and 52) and bus connectors 50 and 54 is performed by connecting an electrode to the periphery bus connector 50, making the conductive parts cathodic. All traces 46, 48, and 52 may be made cathodic by applying a voltage to the periphery bus conductor 50, because either the traces (46 and 48) contact the periphery bus conductor 50 directly, or the traces (52) contact the periphery bus conductor 50 indirectly through the internal bus connector 54. The partially fabricated circuit 36 is placed into an electrolyte containing the ions to be electroplated, preferably gold, and deposition is continued as long as necessary to achieve the required thickness. The plated circuit 36 is removed and excess electrolyte washed away.

The internal bus connectors 54 must be partially or totally removed, as their presence in the finished circuit 36 would provide an unintended current path. The internal bus connectors 54 are removed to avoid unintended cross connections between the orphan traces 52, and also between the traces 52 and other components and the periphery bus connector 50 (which is normally later removed). Preferably, the bus 54 is configured so that it is located at least partially in an area of the support 40 which is to be removed in any event. For example, in the preferred embodiment of the printhead assembly 10, a central portion 56 of the support 40 is necessarily removed so that the support fits over the substrate 14 for electrical connection purposes. The internal bus connector 54 arrangement is therefore designed to be primarily located in the central portion 56 of the support 40, so that opening of an aperture through the support 40 to receive the substrate 14 simultaneously removes a sufficient amount of the bus connector 54 to avoid later short circuits when the multiplexer 42 and substrate 14 are bonded to the traces 38. The central portion 56 is removed to form an aperture entirely through the support 40 by cutting along a line 58, preferably with a die punch. Alternatively, any breaking of the current path along the internal bus connectors 54 between each current carrier that is to remain is sufficient to avoid the presence of an unwanted current path in the finished device. Removal of most of the bus connector 54 is preferred, because precious plated metal can be recovered, and the chances of later failure due to the presence of the unused metal can be reduced.

To complete the fabrication of the printhead assembly 10 device, the multiplexer 42 is fastened with adhesive to the open area on the support 40, and the electrical contacts on the multiplexer 42 are connected to the appropriate traces 38 by thermosonic bonding, welding, TABbonding, or other well known technique. The flexible interconnect circuit 36 is bent to the proper shape to fit over the manifold 30, as shown in FIG. 2, and then attached thereto by adhesive. Electrical contacts are made from the traces 38 to the bonding locations 24 with one of the same types of techniques.

The preferred use of the present invention is with ink jet printer assemblies, but its use is not so limited. In many integrated circuit applications, active components are mounted within the periphery of a TABcircuit interconnect structure. Orphan traces that are to run between the components within the periphery are formed in the conductive metal, and must be plated during the manufacturing operation. The present approach of using removable internal bus connectors permits the orphan traces to be plated by contact to the periphery bus connector through internal bus connectors, which are then removed in whole or in part to avoid unintended interconnections in the final part.

The present approach permits two or more components to be assembled into a device within the periphery of a single flexible interconnect circuit. Special signal processing chips or components can therefore be added to the device, without the need for separate packaging. The newly added components are located in close proximity to the other components, cutting costs and reducing the signal travel times. The present approach does not require any new processing steps, except the final die cutting in those cases which did not previously require a final die cutting. Such die cutting procedures are well known, and add little to the final costs.

Although particular embodiments of the invention have been described in detail for purposes of illustration, various modifications may be made without departing from the spirit and scope of the invention. Accordingly, the invention is not to be limited except as by the appended claims.

What is claimed is:

1. A method for preparing a flexible electrical connector material having conductive traces supported on a nonconductive support, at least some of the traces having no continuous connection to the periphery of the support, comprising the steps of:
   providing a composite of an electrical conductor material on a nonconductive support;
   removing a portion of the electrical conductor material to form a pattern of traces and plating bus connections, the bus connections providing an electrically continuous path from each trace to the periphery of the support;
   electrodepositing a metallic coating over the electrical conductor material, utilizing as one electrodeposition contact the plating bus at the periphery of the support;
   removing the plating bus connections at the periphery of the support; and
   removing by mechanically interrupting at least some portion of the electrical bus connections extending from the periphery of the support to those traces having no continuous connection to the periphery.

2. The method of claim 1, wherein the nonconductive support material is a polyimide.

3. The method of claim 1, wherein the electrical conductor support material is copper.

4. The method of claim 1, wherein the plated metallic coating is gold.

5. A method for forming an electrical device having at least two components interconnected by a flexible electrical connector material having conductive traces supported on a nonconductive support, the components being disposed within the periphery of the nonconductive support, the method comprising the steps of:
   providing a composite of an electrical conductor material on a nonconductive support;
   removing a portion of the electrical conductor material to form a pattern of traces and plating bus connections, the bus connections providing an electrically continuous path from each trace to the periphery of the support;
   electrodepositing a metallic coating over the electrical conductor material, utilizing as one electrodeposition contact the plating bus at the periphery of the support;
   removing the plating bus connections at the periphery of the support;
   removing at least some portion of those plating internal bus connections extending from the periphery of the support to those traces that interconnect the components without otherwise extending to the periphery of the electrically insulating support, this step of removing being accomplished by punching out a portion of the nonconductive support having the bus connections thereon; and
   connecting the electrical connector locations on the electrical components to the appropriate traces of the flexible electrical connector.

6. The process of claim 5, wherein at least one of the electrical components is mounted upon the flexible electrical connector.

7. The method of claim 5, wherein the nonconductive support material is a polyimide.

8. The method of claim 5, wherein the electrical conductor support material is copper.

9. The method of claim 5, wherein the plated metallic coating is gold.

10. The method of claim 5, wherein at least one of the components is an integrated circuit.

11. The method of claim 5, wherein at least one of the components is a thermal ink jet printer ejector.

12. A method for forming an electrical device having at least two components interconnected by a flexible electrical connector material having conductive traces supported on a nonconductive support, the components being disposed within the periphery of the nonconductive support with at least one of the components being mounted on the nonconductive support and at least one of the components being within an aperture through the support, the method comprising the steps of:
   providing a composite of an electrical conductor material on a nonconductive support;
   removing a portion of the electrical conductor material to form a pattern of traces and plating bus connections, the bus connections providing an electrically continuous path from those traces that interconnect between the two components within the periphery of the support, to the periphery of the support;

electrodepositing a metallic coating over the electrical conductor material, utilizing as one electrodeposition contact the plating bus at the periphery of the support;

removing the plating bus connections at the periphery of the support;

mechanically interrupting those plating internal bus connections extending from the periphery of the support to those traces that interconnect the components without otherwise extending to the periphery of the electrically insulating support;

forming at least one aperture through the nonconductive support disposed for mounting a component therein; and connecting the electrical connector locations on the electrical components to the appropriate traces of the flexible electrical connector.

* * * * *